(12) United States Patent
McClellan et al.

(10) Patent No.: US 7,305,642 B2
(45) Date of Patent: Dec. 4, 2007

(54) METHOD OF TILING ANALOG CIRCUITS

(75) Inventors: James F. McClellan, Gilbert, AZ (US); Patrick G. Drennan, Gilbert, AZ (US); Douglas A. Garrity, Gilbert, AZ (US); David R. LoCascio, Chandler, AZ (US); Michael J. McGowan, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 162 days.

(21) Appl. No.: 11/100,039

(22) Filed: Apr. 5, 2005

(65) Prior Publication Data

US 2006/0225011 A1 Oct. 5, 2006

(51) Int. Cl.
*G06F 17/50* (2006.01)
*G06F 19/00* (2006.01)

(52) U.S. Cl. ............................. 716/10; 716/5; 700/97; 700/121

(58) Field of Classification Search ................ 716/10, 716/5; 700/97–98, 119–121
See application file for complete search history.

(56) References Cited

U.S. PATENT DOCUMENTS

| 5,587,923 | A | * | 12/1996 | Wang | 716/13 |
|---|---|---|---|---|---|
| 5,784,289 | A | * | 7/1998 | Wang | 716/8 |
| 6,305,000 | B1 | * | 10/2001 | Phan et al. | 716/5 |
| 6,611,045 | B2 | | 8/2003 | Travis et al. | |
| 6,751,785 | B1 | | 6/2004 | Oh | |
| 6,865,727 | B2 | * | 3/2005 | Frerichs et al. | 716/19 |
| 6,904,581 | B1 | * | 6/2005 | Oh | 716/10 |
| 6,905,967 | B1 | * | 6/2005 | Tian et al. | 438/697 |
| 7,013,446 | B2 | * | 3/2006 | Ohba et al. | 716/10 |
| 7,124,386 | B2 | * | 10/2006 | Smith et al. | 716/10 |
| 2002/0056070 | A1 | * | 5/2002 | Tanaka | 716/2 |
| 2003/0229868 | A1 | * | 12/2003 | White et al. | 716/5 |
| 2004/0069444 | A1 | | 4/2004 | Clifford | |
| 2005/0132306 | A1 | * | 6/2005 | Smith et al. | 716/1 |

* cited by examiner

*Primary Examiner*—Phallaka Kik
*Assistant Examiner*—Patrick Sandoval
(74) *Attorney, Agent, or Firm*—Ingrassia Fisher & Lorenz, P.C.

(57) ABSTRACT

The present invention provides a method for tiling an integrated circuit having a critically matched device such as a transistor. The method obtains an advantage of automatically improving metallic density over critically matched devices thus yielding improved CMP. The method may include the steps of: identifying critically matched devices in the integrated circuit; placing metal tiles over the critically matched device; performing a density test around each critically matched device; and if a density test is not satisfied around a critically matched device, placing at least one metal strip over a critically matched device.

7 Claims, 2 Drawing Sheets

US 7,305,642 B2

METHOD OF TILING ANALOG CIRCUITS

FIELD OF THE INVENTION

The present invention relates to a method of tiling an integrated circuit. More particularly, the invention relates to methods for identifying areas of density failure in an integrated circuit and directing placement of tiles so as to improve the density in those areas of failure.

BACKGROUND OF THE INVENTION

A polishing technique is often used to planarize surfaces of an integrated circuit device during the various stages of the device's fabrication. Chemical Mechanical Polishing (CMP) is a typical procedure that involves combinations of chemical and mechanical process steps to affect planarization.

The degree of planarization achieved by CMP can be affected by the density and uniformity of individual metallic components in a surface to be polished. A more uniform metal density assists in achieving a good polishing. Thus, various design and manufacturing processes have developed density parameters for metal. In order to improve metallic density on a surface or layer of a chip, it is known to insert dummy tiles. A dummy tile is essentially a metallic tile or piece which is placed on a surface or layer of an integrated circuit. Dummy tiles can be strategically placed on a surface, to improve density, and thereby improve polishing.

The performance of certain device components can be adversely affected if, for example, metal is placed above them or non-symmetrically around them. The potential for an adverse affect from metallic tiles is particularly present when the device components are required to match closely as is the case with some transistor shapes. Thus, for example, previous designs have opted not to place dummy tiles above certain components such as transistors and resistors. In particular, the performance of those components that have matched structures may be degraded if a metal tile is improperly placed above the component. If not positioned symmetrically with respect to each component piece, a metal tile may induce a mismatch and/or a parasitic capacitance. Nevertheless, certain devices are so large that the area above them, if left untiled, will lead to insufficient metal density.

Additionally, as the design of integrated circuits becomes increasingly complex, it is desired to provide for a tiling design in an automated procedure. In complex devices having small gate dimensions, an integrated circuit may contain numerous transistors in a variety of locations. The metallic density around each transistor may be different. The tiling design thus involves numerous and tedious calculations.

Additionally, it is desired that a tiling design technique around transistors be suitable for use with whatever metals are being used in other areas of the integrated circuit. The method should also be suitable for use with copper. Finally, the design technique should be suitable for use with current manufacturing methods used in tiling steps.

Accordingly, it is desirable to develop a new method of tiling analog circuits that yields improved results and is relatively inexpensive to use. It would be desirable to develop a system and method for improving the metallic density in layers above matched circuit components such as transistors. It would also be desirable that any process that attempts to provide metallic tiling around such a transistor be an automated process that takes into account the volume of calculations to be done. By virtue of the foregoing, it would further be desirable to develop a new tiling method that allows for improved CMP planarization around transistors. Still further it would be advantageous if the new tiling method were compatible with existing processing equipment and materials that is used in semiconductor manufacturing processes. Other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
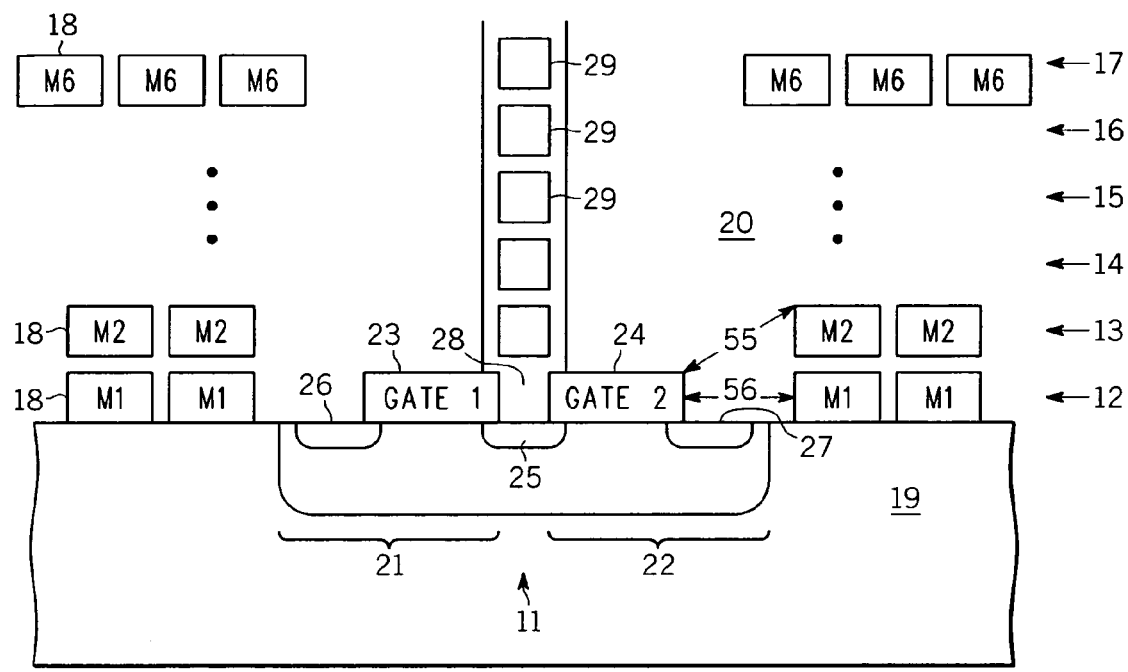
FIG. 1 is a partial cross-sectional view of an integrated circuit showing the placement of dummy tiles according to an embodiment of the present invention.

There is shown in FIG. 1 a cross-sectional view of a portion of an integrated circuit 10. Integrated circuit 10 may be included in a chip having multiple such integrated circuits. Included within this portion of the integrated circuit 10 is critically matched device 11 which itself may include multiple components as described further herein. Integrated circuit 10 includes multiple layers such as first layer 12, second layer 13, etc. through top layer 17. A number of layers different from that shown is possible. Disposed within each layer are dummy tiles 18. Integrated circuit 10 also may include a silicon matrix material 19 and an $SiO_2$ matrix material 20. As represented, silicon matrix material 19 forms a substrate or base layer while $SiO_2$ matrix material 20 forms layers 12 through 17 positioned above the silicon matrix material 19. While silicon and $SiO_2$ matrix materials are indicated in the figure, it will be understood that other matrix materials may be used in the fabrication of the integrated circuit 10. Silicon and $SiO_2$ matrix materials are, however, typical of the matrix materials that may be used in an analog type integrated circuit.

Dummy tiles 18 preferably comprise pieces of metallic or other filler material. Dummy tiles 18 are placed in layers 12-17 in order to assist with metallic density. The placement and quantity of dummy tiles 18 are typically determined at the end of the design and development of an integrated circuit. During manufacturing, dummy tiles 18 are placed in each successive layer 12-17, as these layers are built up. Dummy tiles 18 assist in improving the metallic density of integrated circuit 10 so that the effectiveness of CMP operations during manufacturing may be improved. It is generally important for precision analog circuit performance that dummy tiles 18 be placed within integrated circuit 10 so as to minimize and balance associated parasitic capacitances. Thus, dummy tiles 18 are spaced, sometimes at minimum distances, from each other. Additionally, dummy tiles 18 are spaced, again sometimes at minimum distances, as limited and determined by a minimum allowable parasitic capacitance from circuit devices and components. With respect to a critically matched device 11, the prior art teaches that dummy tiles 18 not be placed in those positions above the critically matched device 11 lest the device performance be adversely affected. Known methods for placement of dummy tiles are referred to as "rule based" or "model based" placement processes. Dummy tiles 18 may be fabricated of a number of different kinds of metallic materials, including copper.

As illustrated in the embodiment of FIG. 1, critically matched device 11 comprises a pair of transistors. Thus, critically matched device 11 includes a first transistor 21 and second transistor 22. Further, critically matched device 11 includes first gate 23 and second gate 24. First gate 23 and second gate 24 are positioned in the gate layer 12, the layer that includes these gates. Shared source 25 is positioned between first gate 23 and second gate 24. First drain 26 is connected to first gate 23, and second drain 27 is connected to second gate 24. The area between first gate 23 and second gate 24 is area of symmetry 28. Also shown in FIG. 1 are metal strips 29 positioned in the area of symmetry 28 above the gate layer 12. A metal strip 29 is place in each layer 13-17 above the gate layer 12.

Figure 2:
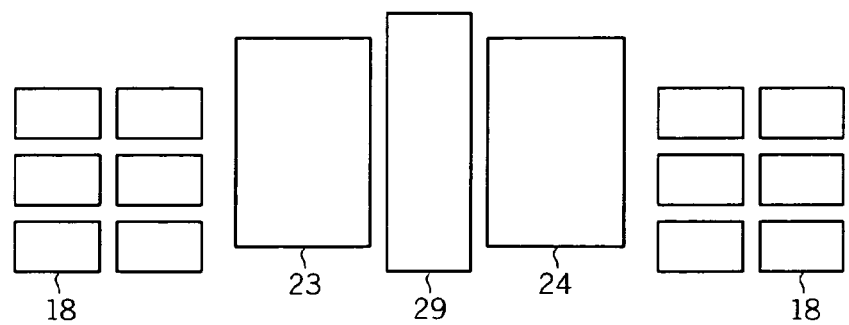
FIG. 2 is a top view of the integrated circuit of FIG. 1 showing the placement of a metal strip over a critically matched device according to the embodiment of the present invention.

Referring now to FIG. 2, there is shown a top view of integrated circuit 10. Many of the features that appeared in integrated circuit 10, as illustrated in FIG. 1, also appear in FIG. 2 from the top perspective. Dummy tiles 18 are again shown as positioned in areas that symmetrically surround critically matched device 11. Each dummy tile 18 is positioned some minimum lateral distance from a neighboring dummy tile as well as some minimum lateral distance from critically matched device 11. FIG. 2, however, only illustrates the top layer of dummy tiles 18 as lower layers of tiles are overlapped by the top layer of tiles because tiles in different layers are placed in the same lateral positions. In other embodiments, dummy tiles 18 in different layers 12-17 need not overlap each other. From the perspective of FIG. 2 metal strip 29 is again shown as positioned over the area of symmetry 28 such that metal strip 29 does not overlie either first gate 23 or second gate 24. The metal strips in layers 12-16 preferably lie underneath the metal strip 29 positioned in top layer 17. Preferably, metal strips 29 are positioned so that they are symmetrically positioned with respect to first gate 23 and second gate 24.

Metal strips 29 are comprised of any material that may also serve as a material for dummy tiles 18, such as for example copper and other metals. The purpose of metal strips 29 is also similar to that of dummy tiles 18. The presence of metal strips 29 over a critically matched device 11 assists with CMP in that area. Metal strips 29 increase metal density in areas where dummy tiles 18 could not be placed, thus improving CMP processing in that area. Metal strips 29 are preferably placed over area of symmetry 28 so as to be symmetric with respect to first gate 23 and second gate 24. By so positioning metal strips 29, capacitance is minimized. Given the relatively narrow area defined by area of symmetry 28, metal strips 29 may take on a narrow and elongated shape, a strip-like shape. Thus, metal strips 29 serve to allow an incremental improvement in regional metal density.

Having described the invention from a structural standpoint, a method and manner of using the invention will now be described.

Figure 3:
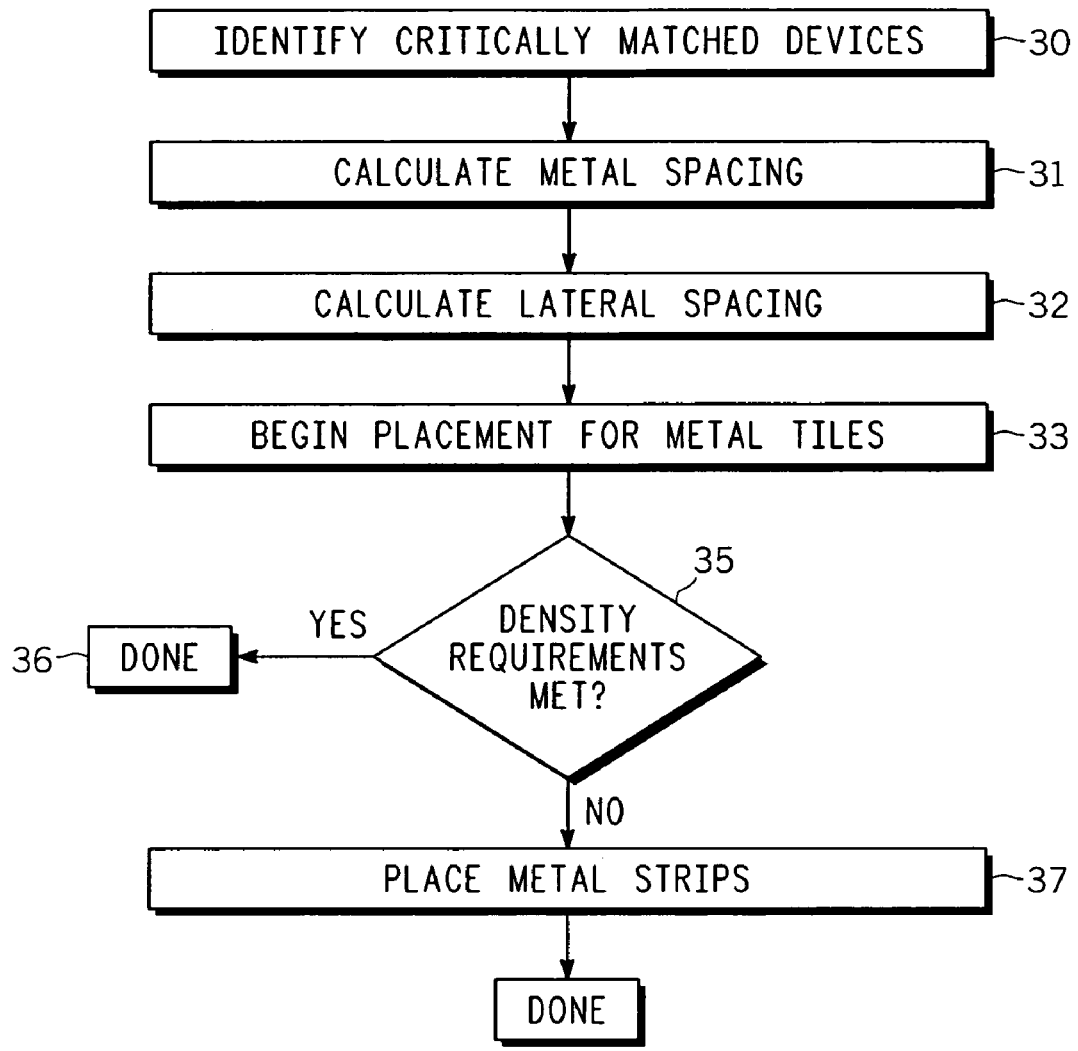
FIG. 3 is a flow diagram showing steps in a method to identify and place metal strips over a critically matched device according to the embodiment of the present invention.

Referring now to FIG. 3 there is shown a flow diagram illustrating steps in a method to place metal strips over critically matched devices. The process begins with step 30, identifying the critically matched devices.

Following this, in step 31, the process calculates an allowable metal spacing. Metal spacing is shown as 55 in FIG. 1. Metal spacing 55 represents a minimum radial distance between a source and/or drain of a transistor and a proximate metal tile. The calculation for spacing 55, known in the art, is based on criteria for the maximum allowable parasitic capacitance and dielectric constant for the tiling materials.

In a next step, step 32, the method calculates an allowable lateral spacing. Lateral spacing is shown as 56 in FIG. 1 and represents the minimum spacing, in the transistor layer, between a transistor and an adjacent metal tile. Lateral spacing 56 is based on the calculation for metal spacing 55. Lateral spacing 56 is the component of metal spacing 55 in a single plane. Configuring metal spacing 55 as a vector having a vertical and lateral component, lateral spacing 56 represents the lateral component.

Following this, in step 33 the process positions dummy tiles 18 that are not to be placed over a critically matched device 11. It is noted that step 31 places dummy tiles 18 that do not overlie a critically matched device 11. The positioning of dummy tiles 18 follows the minimum lateral and metal spacings previously calculated.

Having placed the dummy tiles, the process tests whether density requirements are now satisfied, step 34. In particular, this density test is performed in those areas around a critically matched device. Density testing includes those processes known in the art whereby sequential areas of a chip are tested for minimum metal density. The testing progresses until a desired overall area of the chip has been evaluated. Thus, in an automated process density is evaluated incrementally, at various areas, not globally. A typical evaluation involves density testing in a 50 by 50 micron block. Other areas than 50 by 50 may be used. If a block passes the density test, the process moves on to the next block. The test for density may also involve pass/fail parameters, e.g., a metal density factor above 20% and below 80%. Other evaluation criteria may also be followed. If the density requirements are satisfied, the process is completed, step 35.

However, if the density requirements are not satisfied, the process includes an additional step 37. This step is the placement of metal strips 29 over the critically matched device 11. Placement of a metal strip 29 over a critically matched 11 device includes placement of the metal strip 29 such that the metal strip 29 substantially overlies the area of symmetry 28 between each twinned component of a critically matched device 11. Taking as an example the transistors of FIG. 1, a critically matched transistor typically includes a twinned pair of structures, such as gates. The region between the gates, a region that includes the source region, is the area of symmetry. In the process, at step 37, metal strips 29 are positioned so as to appear in each layer above the critically matched device.

In a preferred embodiment, metal strips 29 are placed over each critically matched device where there is a failure of a density test. Metal strips 29 preferably are not placed over critically matched devices where there is no failure of a density test.

It is also noted that a critically matched device may include more than one area of symmetry. Again considering the case of a transistor, transistors of the type included in an integrated circuit may include multiple fingers. A single transistor device may be broken into multiple sources and drains. In this kind of configuration each source/drain pair is joined by an area of symmetry.

Thus, referring again to FIG. 1 critically matched device 11, shown as a pair of matched transistors, includes first gate 23 and second gate 24. Positioned therebetween is shared source 25. Referring now to FIG. 2, a similar device is shown from a top view perspective. In FIG. 2 the area of symmetry 24 is illustrated as that region lying coextensive with source 21 and drain 22.

It is also possible to apply the tiling method to transistors having a multifingered structure. A multifingered structure includes multiple matched areas, such as a multigated device. A multifingered transistor may be a single transistor broken into multiple fingers. In such an embodiment, the method calls for positioning a metal strip 29 at each area of symmetry between each transistor finger. Thus, referring again to FIG. 1, the structure of FIG. 1 may be a partial illustration of a larger transistor. Where multiple finger structures exist, with an area of symmetry associated with each finger, a metal strip 29 is placed over each area of symmetry at each gate.

In a preferred embodiment, the method of placing dummy tiles is also a computer automated process. Thus the steps, for example shown in FIG. 3 are placed into a suitable programming language such as the CAD program CADENCE. Other suitable programs may also be used. In this embodiment, a system may be configured so as to implement the process of FIG. 3. A system capable of carrying out the tiling method, according to an embodiment of the invention includes a memory, processor, input, and output. The system further includes a program that embodies the steps of the method in FIG. 3. Further the system includes electronic data to represent an integrated circuit design.

In one embodiment, there is provided a method for placing tiles in an integrated circuit having critically matched devices, the method includes the steps of: identifying critically matched devices in the integrated circuit; calculating a metal spacing for tiles in the integrated circuit; calculating a lateral spacing for tiles in the integrated circuit; placing tiles around the critically matched devices based on the metal spacing and the lateral spacing; performing a density test over each critically matched device; and if a density test is not satisfied over a critically matched device, placing at least one metal strip over a critically matched device.

In a further embodiment of the above method the integrated circuit has more than one layer and the step of placing at least one metal strip further includes placing a metal strip in each layer of the integrated circuit above the critically matched device.

In a further embodiment of the method the step of placing at least one metal strip further comprises placing at least one metal strip over a transistor.

In a further embodiment the method further comprises placing at least one metal strip over a transistor such that the metal strip substantially overlies an area of symmetry of the transistor.

In a further embodiment of the method the metal strip is substantially the same length as the transistor gate.

In a further embodiment of the method the metal strip is substantially the same width as the transistor gate.

In a further embodiment the method further comprises the step of placing a metal strip over a transistor having a first gate and a second gate such that the metal strip is substantially symmetrically positioned with respect to the first gate and the second gate.

In a further embodiment of the method the step of performing a density test over each critically matched device further comprises measuring metallic density in sequential areas of the integrated circuit.

In a further embodiment the method further comprises comparing metallic density in an area of the integrated circuit to a minimum and a maximum.

In another embodiment of the invention there is provided an integrated circuit comprising: at least one critically matched device having an area of symmetry; and at least one metal strip placed over a critically matched device so as to substantially overlie the area of symmetry.

In a further embodiment of the integrated circuit the critically matched device comprises a transistor.

In a further embodiment of the integrated circuit the transistor comprises a first gate, a second gate, and a common source disposed therebetween wherein the metal strip is placed so as to substantially overlie the common source.

In a further embodiment of the integrated circuit the metal strip is substantially the same length and width as the common source.

In a further embodiment of the integrated circuit the metal strip is placed so as to be substantially symmetric with respect to the first gate and the second gate.

In a further embodiment of the integrated circuit the critically matched device comprises a plurality of areas of symmetry and wherein a metal strip is placed over each such area of symmetry.

In a further embodiment of the integrated circuit the integrated circuit comprises more than one layer and further comprises a metal strip placed at each layer above the critically matched device.

In still another embodiment of the invention there is provided a system for automatically placing tiles in an integrated circuit having critically matched devices, the system comprising: means for inputting data to the system; means for outputting data from the system; a memory; and a processor linked to the means for inputting, means for outputting, and memory, and wherein the processor is configured so as to identify critically matched devices; calculate a metal spacing for tiles in the integrated circuit; calculate a lateral spacing for tiles in the integrated circuit; place tiles around the critically matched devices; determine whether a density test is satisfied over each critically matched device; and if a density test is not satisfied, place at least one metal strip over a critically matched device that does not satisfy the density test.

In a further embodiment the system further comprises a processor configured so as to place a metal strip in each layer over a critically matched device if a density test is not satisfied.

In a further embodiment the system further comprises a processor configured so as to identify critically matched transistors; place tiles around the critically matched transistor; determine whether a density test is satisfied over each critically matched transistor; and if a density test is not satisfied, place at least one metal strip over a critically matched transistor that does not satisfy the density test.

In a further embodiment of the system the processor is configured so as to place at least one metal strip over an area of symmetry of a critically matched transistor.

While at least one exemplary embodiment has been presented in the foregoing detailed description of the invention, it should be appreciated that a vast number of variations exist. For example metals other than copper may be used as the metal. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for placing tiles in an integrated circuit having critically matched devices, the method comprising the steps of:
   identifying critically matched devices in the integrated circuit;
   calculating a metal spacing for tiles in the integrated circuit;
   calculating a lateral spacing for tiles in the integrated circuit;
   placing tiles around the critically matched devices based on the metal spacing and the lateral spacing;
   performing a density test over each critically matched device; and
   if a density test is not satisfied over a critically matched device, placing at least one metal strip over a transistor;
   wherein the transistor includes a gate and wherein the metal strip is substantially the same length as the transistor gate.

2. The method according to claim 1, wherein the integrated circuit has more than one layer and wherein the step of placing at least one metal strip further comprises placing a metal strip in each layer of the integrated circuit above the critically matched device.

3. The method according to claim 1, wherein the transistor includes an area of symmetry and the method further comprising placing at least one metal strip over a transistor such that the metal strip substantially overlies an area of symmetry of the transistor.

4. The method according to claim 1, wherein the step of performing a density test over each critically matched device further comprises measuring metallic density in sequential areas of the integrated circuit.

5. The method according to claim 4 further comprising comparing metallic density in an area of the integrated circuit to a minimum and a maximum.

6. A method for placing tiles in an integrated circuit having critically matched devices, the method comprising the steps of:
   identifying critically matched devices in the integrated circuit;
   calculating a metal spacing for tiles in the integrated circuit;
   calculating a lateral spacing for tiles in the integrated circuit;
   placing tiles around the critically matched devices based on the metal spacing and the lateral spacing;
   performing a density test over each critically matched device; and if a density test is not satisfied over a critically matched device, placing at least one metal strip over a transistor;
   wherein the transistor includes a source or drain and wherein the metal strip is substantially the same width as the transistor source or drain.

7. A method for placing tiles in an integrated circuit having critically matched devices, the method comprising the steps of:
   identifying critically matched devices in the integrated circuit;
   calculating a metal spacing for tiles in the integrated circuit;
   calculating a lateral spacing for tiles in the integrated circuit;
   placing tiles around the critically matched devices based on the metal spacing and the lateral spacing;
   performing a density test over each critically matched device; and
   if a density test is not satisfied over a critically matched device, placing a metal strip over a transistor having a first gate and a second gate such that the metal strip is substantially symmetrically positioned with respect to the first gate and the second gate.

* * * * *